United States Patent [19]
Konishi

[11] Patent Number: 5,359,215
[45] Date of Patent: Oct. 25, 1994

[54] SEMICONDUCTOR MEMORY CELL FOR HOLDING DATA WITH SMALL POWER CONSUMPTION

[75] Inventor: Yasuhiro Konishi, Hyogo, Japan

[73] Assignee: Mitsubishi Denki Kabushiki Kaisha, Tokyo, Japan

[21] Appl. No.: 795,865

[22] Filed: Nov. 22, 1991

[30] Foreign Application Priority Data

Nov. 26, 1990 [JP] Japan .................................. 2-324268

[51] Int. Cl.$^5$ .......................................... H01L 29/78
[52] U.S. Cl. .................... 257/296; 257/297; 257/301; 257/302; 257/306
[58] Field of Search ............... 365/149, 186; 257/296, 257/301, 306, 302, 297

[56] References Cited

U.S. PATENT DOCUMENTS

| | | | |
|---|---|---|---|
| 4,151,610 | 4/1979 | Suzuki et al. | 257/300 |
| 4,156,939 | 5/1979 | Takemae et al. | 257/300 |
| 4,392,210 | 7/1983 | Chan | 257/300 |
| 4,927,779 | 5/1990 | Dhong et al. | 257/301 |
| 4,937,645 | 6/1990 | Ootsuka et al. | 257/296 |
| 5,006,909 | 4/1991 | Kosa | 257/302 |

FOREIGN PATENT DOCUMENTS 0357980  3/1990  European Pat. Off. ............ 365/149

*Primary Examiner*—Jerome Jackson
*Attorney, Agent, or Firm*—Lowe, Price, LeBlanc & Becker

[57] ABSTRACT

A DRAM includes an N-type well formed on a main surface of a P-type semiconductor substrate, an N-type impurity region formed on the main surface of the P-type semiconductor substrate, a P-type impurity region formed in the N-type well to be a storage node of a memory capacitor, and a polycrystalline silicon layer for connecting the P-type impurity region and the N-type impurity region. The N-type impurity layer, the P-type impurity layer, and the polycrystalline silicon layer constitute the storage node of the memory capacitor, and electrons of minority carriers flowing from the substrate to the N-type impurity layer are recombined with holes flowing from the N-type well to the P-type impurity layer.

7 Claims, 11 Drawing Sheets

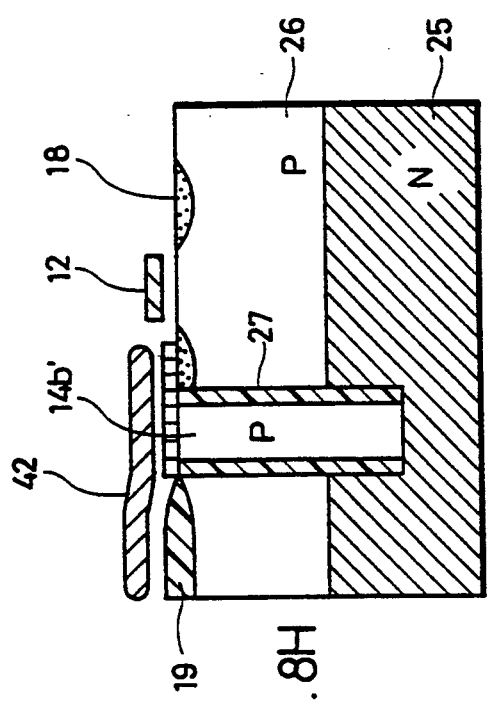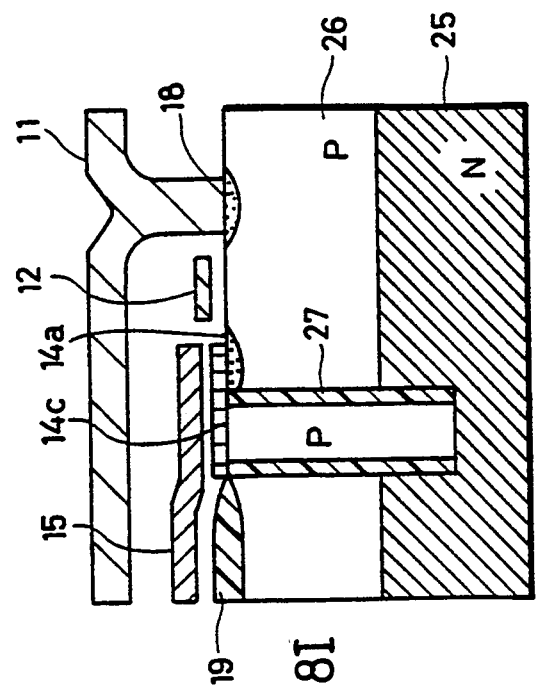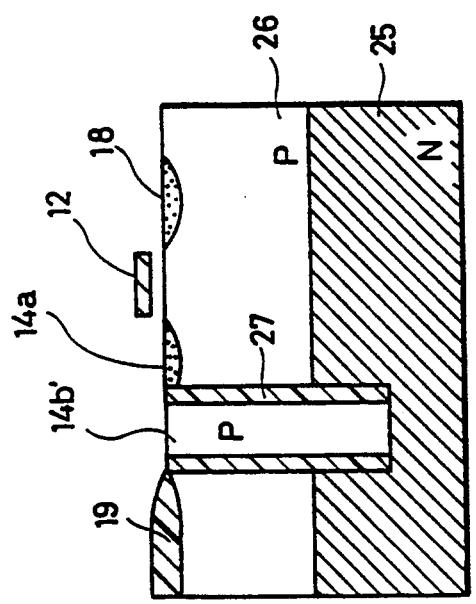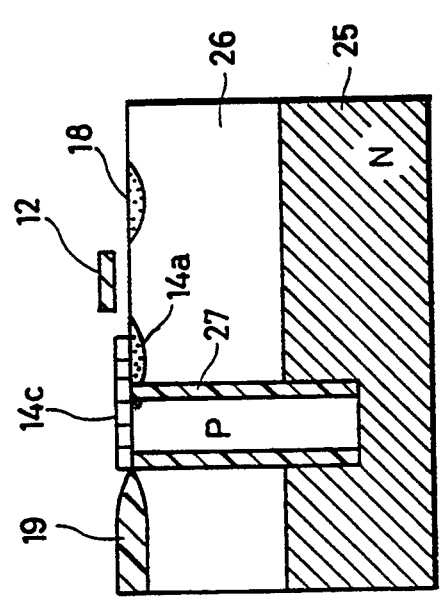

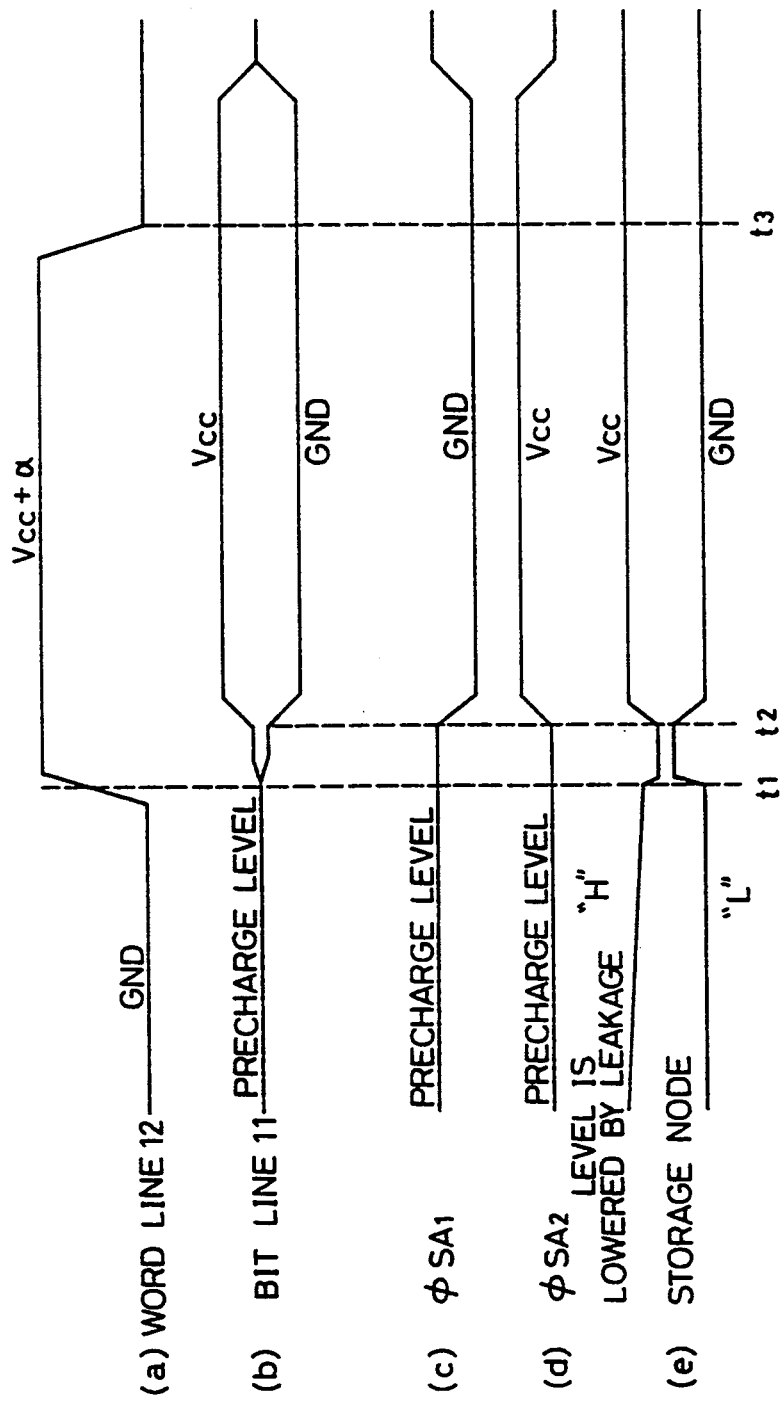

SEMICONDUCTOR MEMORY CELL FOR HOLDING DATA WITH SMALL POWER CONSUMPTION

BACKGROUND OF THE INVENTION

1. Field of the Invention

The present invention relates generally to semiconductor memory cells and, more particularly, to a semiconductor memory cell capable of preventing excessive power consumption.

2. Description of the Background Art

FIG. 9 is a block diagram illustrating an example of a conventional dynamic random access memory (hereinafter referred to as a DRAM) which is generally known. Referring to FIG. 9, the DRAM includes a memory array 58 provided with memory cells for storing a data signal, an address buffer 54 for receiving an address signal for selecting a memory cell, a row decoder 55 and a column decoder 56 for decoding the address signal, and a sense amplifier 63 connected to memory array 58 for amplifying and reading the signal stored in the memory cell. An input buffer 59 for inputting a data signal and an output buffer 60 for outputting a data signal are connected through an I/O gate 57 to memory array 58.

Address buffer 54 is provided to receive external address signals ext.A0 to A9 or internal address signals Q0 to Q8 generated by a refresh counter 53. A refresh controller 52 drives refresh counter 53 in response to timing of a $\overline{RAS}$ signal and a $\overline{CAS}$ signal applied to a clock generator 51.

An RAS buffer 64 is provided in clock generator 51, and an activation signal S is applied therefrom through a sense amplifier controller 65 to a sense amplifier 63.

FIG. 10A is a cross sectional view of a memory cell included in a memory array 58 illustrated in FIG. 9, and FIG. 10B is an equivalent circuit diagram of the memory cell.

Referring to FIG. 10A, a memory cell includes a storage capacitor 16 formed on a main surface of a P-type semiconductor substrate 13 for storing a charge and an access transistor 17 provided adjacent to storage capacitor 16. Storage capacitor 16 includes an N-type impurity region 14 formed on the main surface of semiconductor substrate 13 to be a storage node and a cell plate 15 formed on N-type impurity region 14 with an insulating film interposed therebetween. Access transistor 17 includes N-type diffusion layers 14, 18 to be source/drain regions and a gate electrode 12 to be a word line formed between N-type diffusion layers 14 and 18 with the insulating film interposed therebetween. A bit line 11 is connected to N-type diffusion layer 18 to be a source/drain region. A memory cell is separated from an adjacent memory cell using a field oxide film 19.

Now, operations of writing into the memory cell and reading from the memory cell will be described with reference to FIGS. 10A and 10B.

In the case of writing, data to be written is externally transmitted to bit line 11, then the potential of word line 12 is raised to Vcc or more, a potential of storage node 14 implemented with an N-type diffusion region formed in P-type substrate 13 becomes vcc (a high or "H" level) or GND (a low or "L" level), and a charge is stored in storage capacitor 16 formed of storage node 14 and cell plate 15. In the case of reading, the potential of word line 12 is raised, and the charge stored in storage node 14 is applied to bit line 11 and amplified by the sense amplifier. Respective memory cells are separated from one another by a $SiO_2$ film serving as the field insulating film.

Storage node 14 is connected to the source of access transistor 17 so that a little leak current flows from the PN junction through a parasitic diode 20 to the substrate. The potential of P-type substrate 13 is normally kept at a negative potential by a power supply 21 in a DRAM, so that the potential of storage node 14 in which "H" level is written is lowered by electrons (indicated by arrow A) flowing from the substrate as time passes. Therefore, in a DRAM, it is necessary to perform rewriting referred to as "a refresh operation" every predetermined time. This will be described with reference to FIGS. 11A, 11B and 12 in the following.

FIG. 11A is a typical diagram illustrating a specific arrangement of memory array 58 in the general DRAM illustrated in FIG. 10, FIG. 11B is a diagram illustrating details of sense amplifier 2, and FIG. 12 is a timing diagram for explaining the refresh operation. The refresh operation is the same operation as reading in which the potential of a word line 12 is selectively raised at time t1, and storage nodes 14 of a plurality of memory cells 1 connected thereto are electrically connected to bit lines 11 charged to a precharge level. After a charge stored in storage capacitor 16 of each memory cell 1 is discharged onto a bit line 11, sense amplifier 2 is activated by activation signals $\phi SA1$, $\phi SA2$ at time t2. The potential of bit line 11 is amplified to the Vcc level or the GND level, and that potential is applied to storage node 14. Then, the potential of word line 12 is lowered at time t3. With this operation, it is possible to make the potential of the storage node to be kept at "H" level, which was lowered by the leak current, recover to Vcc as illustrated in FIG. 12(e).

Now, the current consumed in the refresh operation will be calculated in the following. First, the charge $Q_{BL}$ necessary for charging bit line 11 is expressed by an expression $Q_{BL} = (\frac{1}{2})V_{cc} \times C_{BL} \times N$, wherein $C_{BL}$ expresses the stray capacitance of the bit line, and N expresses the number of bit lines activated by one refresh operation.

Besides, a charge of $Q_P$ is consumed in the address buffer, a word line driving circuit, and so on. Furthermore, a current of $I_O$ is always consumed in a substrate voltage generating circuit for applying a negative potential to P-type substrate 13 and so on regardless of the refresh operation. Finally, if the frequency of the refresh operation is expressed by $f_{ref}$, the mean current $I_{ref}$ in the refresh operation is expressed by an expression $$I_{ref} = (Q_{BL} + Q_P) \cdot f_{ref} + I_o \qquad (1).$$

The ratio of the first term of expression (1) to the second term of it is: in a case where $f_{ref}$ is 64kHz, for example, $(Q_{BL} + Q_P) \cdot f_{ref}$ is approximately 450 μA, and $I_o$ is approximately 50 μA, and the ratio is approximately 9:1.

Since there is only a PN junction between a P-type substrate and an N-type diffusion region in a storage node of a memory cell in a conventional DRAM, electrons flow from the substrate into the storage node to lower the potential of the storage node. Therefore, a refresh operation is necessary for holding data. However, the refresh operation is complicated and consumes excessive power for every refresh operation.

SUMMARY OF THE INVENTION

Accordingly, an object of the present invention is to dispense with refresh operation in a DRAM.

Another object of the present invention is to reduce power consumption for refresh operation in a DRAM.

Still another object of the present invention is to suppress fluctuations in the potential of a storage node caused by a leak current flowing between the storage node and a substrate in a DRAM.

A further object of the present invention is to eliminate power consumption in refresh operation in a DRAM with a simple structure.

A still further object of the present invention is to reduce power consumption for refresh operation in a DRAM including a trench-type capacitor.

Still a further object of the present invention is to simplify a method of manufacturing a DRAM wherein power consumption for refresh operation is small.

The above objects of the present invention is achieved by a DRAM including the following elements. Specifically, a DRAM according to the present invention includes a semiconductor substrate of a first conductivity type having a main surface, a first region of a second conductivity type formed on the main surface of the semiconductor substrate, a second region of the second conductivity type formed on the semiconductor substrate of the first conductivity type, a third region of the first conductivity type formed in the first region of the second conductivity type and also on the main surface of the semiconductor substrate, and a first conductive layer connecting the second region of the first conductivity type and the third region of the second conductivity type. The third region of the first conductivity type, the second region of the second conductivity type, and the first conductive layer constitute a storage node of the DRAM, and first minority carriers flowing from the semiconductor substrate to the second region of the second conductivity type are recombined with second minority carriers flowing from the first region of the second conductivity type to the third region of the first conductivity type.

Since the first minority carriers flowing from the semiconductor substrate to the second region of the second conductivity type are recombined with the second minority carriers flowing from the first region of the second conductivity type to the third region of the first conductivity type in the DRAM, fluctuations in the potential of the storage node of the DRAM are not caused. As a result, refresh operation becomes unnecessary in the DRAM.

According to another aspect of the present invention, a DRAM includes a semiconductor substrate of a first conductivity type having a main surface and an impurity layer of a second conductivity type formed on the main surface of the semiconductor substrate, and minority carriers of the first conductivity type flow from the semiconductor substrate to the impurity layer of the second conductivity type to cause the potential of the impurity layer of the second conductivity type to fluctuate, and the DRAM further includes compensating means formed on the main surface of the substrate for compensating fluctuations in the potential of the impurity layer of the second conductivity type caused by the minority carriers.

Fluctuations in the potential of the impurity layer of the second conducting type caused by the minority carriers flowing from the substrate are compensated by the compensating means. As a result, power consumption for refresh operation is reduced in the DRAM.

According to still another aspect of the present invention, a DRAM includes a memory cell implemented with one transistor and one capacitor formed on a semiconductor substrate having a main surface, wherein the capacitor includes a storage node formed on the main surface of the semiconductor substrate and a cell plate formed on the storage node with an insulating film interposed therebetween, and minority carriers flow from the semiconductor substrate to the storage node, and the DRAM further includes compensating means connected to the storage node for compensating fluctuations in the potential of the storage node caused by the minority carriers.

Fluctuations in the potential of the storage node caused by the minority carriers flowing from the semiconductor substrate to the storage node are compensated for by the compensating means in the memory cell implemented with one transistor and one capacitor. As a result, fluctuations in the potential of the storage node caused by a leak current flowing between the storage node and the substrate are suppressed in the DRAM.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 8A to 8I are cross sectional views illustrating respective steps of a manufacturing process of the memory cell illustrated in FIG. 4.

FIG. 12 is a timing diagram for explaining a refresh operation of a general DRAM.

DESCRIPTION OF THE PREFERRED EMBODIMENTS.

An embodiment of the present invention will be described with reference to the drawings in the following.

Figure 1:
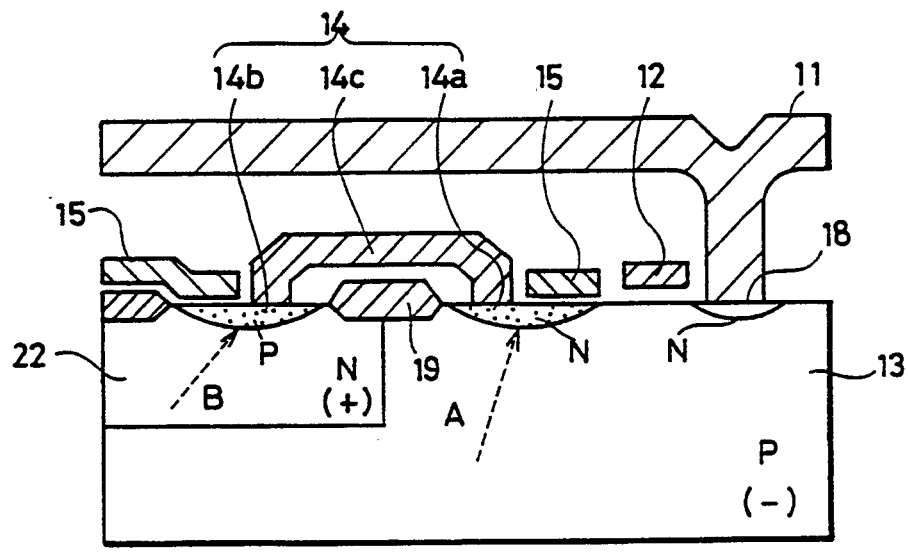
FIG. 1 is a cross sectional view of a memory cell according to the present invention.
Figure 2:
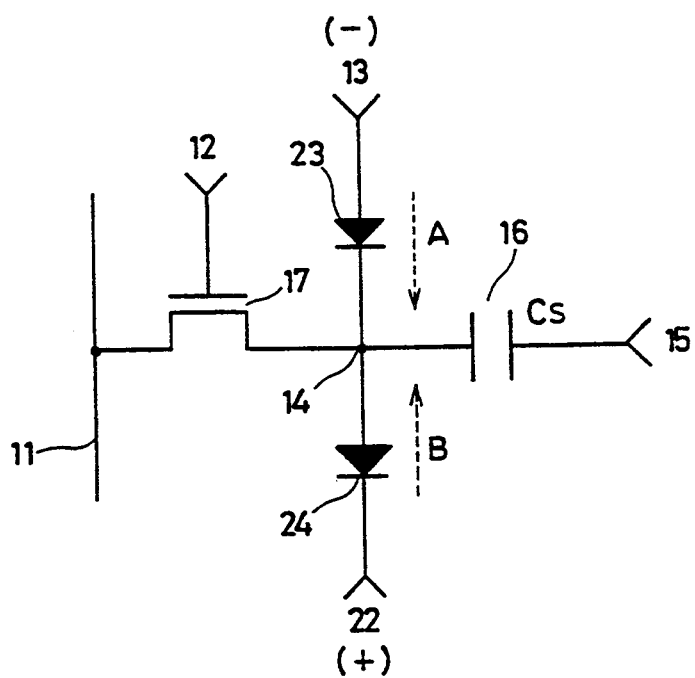
FIG. 2 is an equivalent circuit diagram of a memory cell according to the present invention.

Referring to FIGS. 1 and 2, a storage node 14 includes an N-type diffusion region 14a provided in a P-type substrate 13 to which a negative substrate potential is applied, a P-type diffusion region 14b provided in an N-type well 22 to which a potential of $V_{cc}+\alpha$ is applied, and a metal interconnection layer 14c formed of aluminum or the like connecting N-type diffusion region 14a and P-type diffusion region 14b. α is added to the potential of N-type well 22 in order to prevent PN junctions implemented with P-type diffusion region 14b and N-type well 22 from being in a forward direction.

The areas of the two PN junctions are the same. When the number of electrons thermally generated in P-type substrate 13 and the number of holes thermally generated in N-type well 22 are equal, electrons generated in P-type substrate 13 flow into storage node 14 from the junction of N-type diffusion region 14a shown with a diode 23 as shown by arrow A. Holes generated in N-type well 22 flow into storage node 14 from the junction of P-type diffusion region 14b shown with a diode 24 as shown by arrow B. As described above, if the areas of both junctions are equal, it is considered that the number of the flowing electrons and the number of the flowing holes are approximately equal. As a result, they are combined with each other, and the potential of the storage node 14 is not changed.

When the number of charges generated in P-type substrate 13 and the number of charges generated in N-type well 22 are different or when the current flowing from one of the two junctions for a unit area is different from the current flowing from the other junction for a unit area are different, the ratio of the area of one of the PN junctions to the area of the other PN junction may be determined so that the currents flowing from both junctions are equal. Even if the current flowing to the storage node 14 cannot be 0 in effect, the leak current value in that case is much smaller than the current value in the conventional memory cell, so that the intervals of refreshment can be much longer than in the conventional one, and the current for the refresh operation can be remarkably reduced. Cell plate 15 is formed of polycrystalline silicon.

Figure 3:
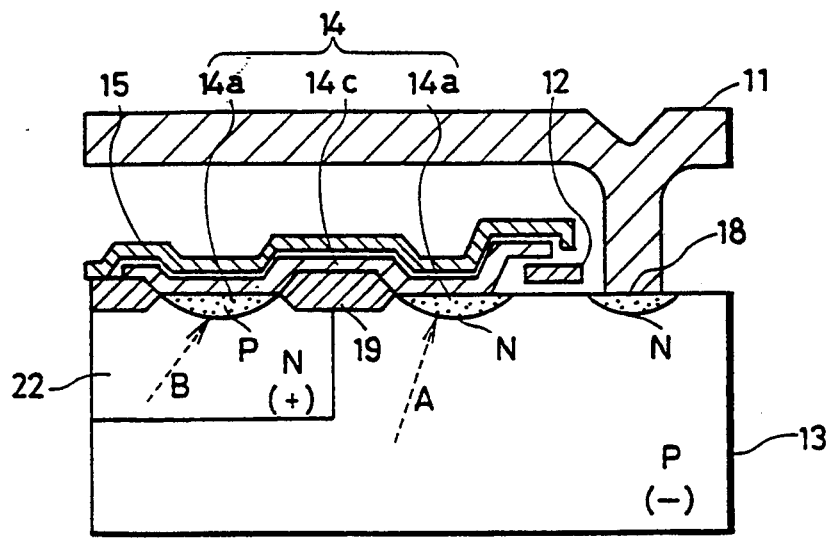
FIGS. 3, 4 and 6 are cross sectional views of a memory cell according to another embodiment of the present invention.

FIG. 3 is a cross sectional view of another embodiment of the present invention. While a planar-type capacitor including a diffusion region and cell plate 15 formed of polycrystalline silicon was used as a capacitor in the example in FIG. 2, a stack capacitor including a cell plate 15 implemented with an interconnection layer (formed of polycrystalline silicon or the like) provided above the substrate and an interconnection layer 14c is employed in this embodiment. Basic effects in this case are the same as those in the case of FIG. 2. Interconnection layer 14c (formed of tungsten, for example) connecting N-type diffusion region 14a and P-type diffusion region 14b serves as one electrode of the capacitor, so that it is possible to use the area of the layout of the memory cell effectively. In addition, it is possible to increase the capacitance of the capacitor.

Figure 4:
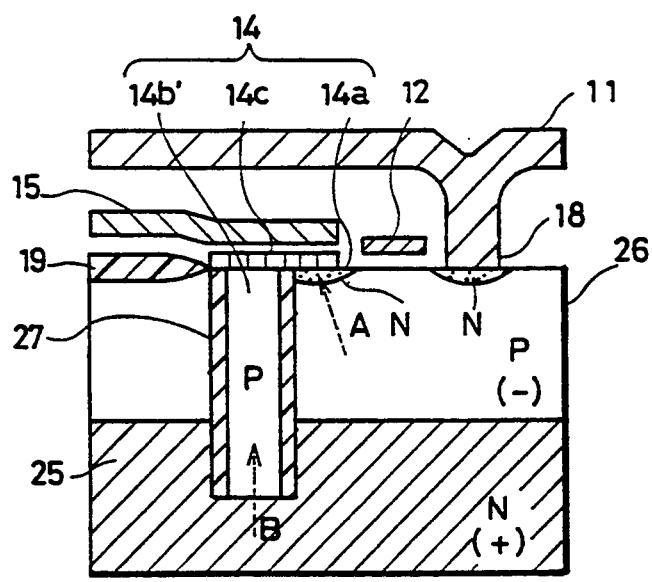

FIG. 4 is a cross sectional view of still another embodiment of the present invention. A P-type epitaxial layer 26 is stacked on an N-type substrate 25, and a hole is provided in the surface of the substrate. An insulating film 27 is formed on the inner wall of the hole, and P-type polycrystalline silicon 14b' is buried thereinto so as to provide a junction with N-type substrate 25 on the bottom surface. An N-type diffusion region 14a is provided on the surface of P-type epitaxial layer 26, and a PN junction is also formed there. Finally, P-type polycrystalline silicon 14b' and N-type diffusion region 14a are connected by an interconnection layer 14C formed of a refractory metal such as tungsten. It is possible to implement a memory cell according to the present invention with a small area by implementing a memory cell of a trench type.

Figure 5:
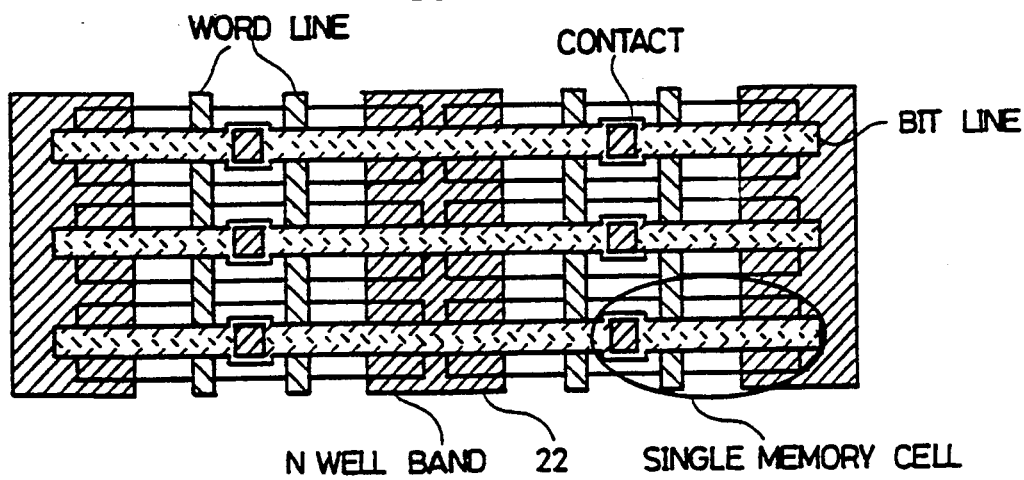
FIG. 5 is a plane view of the memory cell region illustrated in FIGS. 3 and 4.

FIG. 5 is a plane view schematically illustrating the memory array illustrated in FIGS. 2 and 3. Referring to FIG. 5, it is possible to reduce the unnecessary region required for securing the distance between N-type well 22 and N-type diffusion region 14a by providing a common band-shaped N-type well region 22 of adjacent memory cells.

Figure 6:
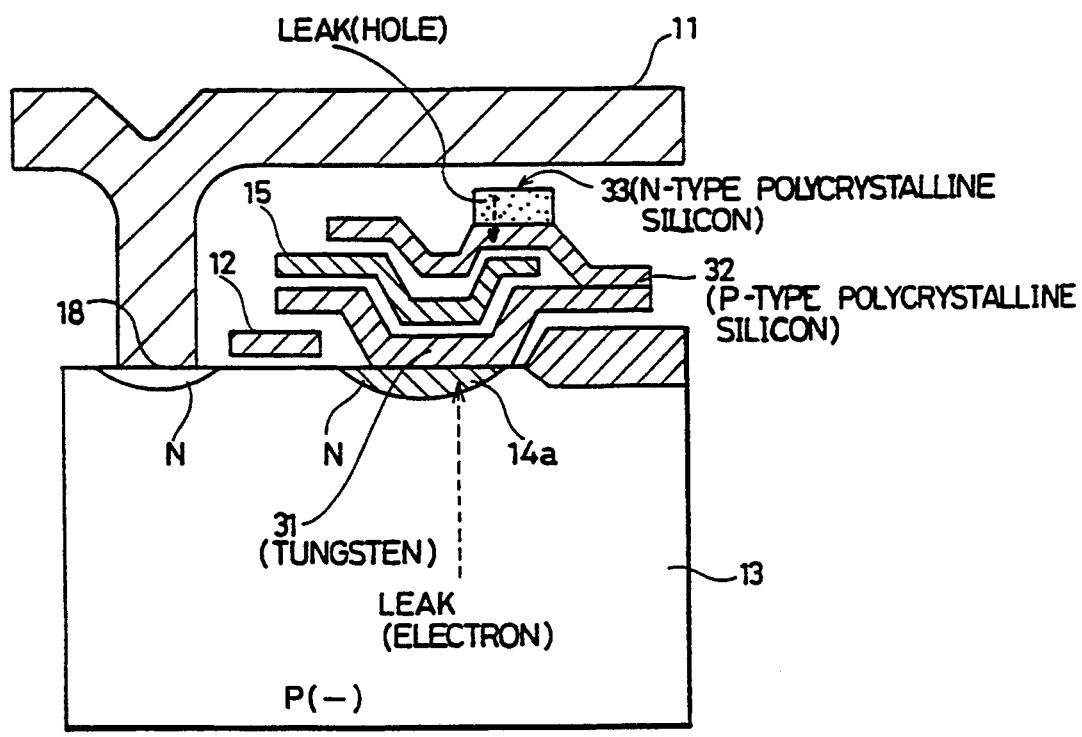

FIG. 6 illustrates a further embodiment according to the present invention. Elements in this embodiment corresponding to elements in FIGS. 3 and 4 are given the same reference numerals as those in FIGS. 3 and 4. Referring to FIG. 6, a storage node 32 formed of P-type polycrystalline silicon is provided in the upper part of a storage node 31 formed of tungsten. N-type polycrystalline silicon 33 to which a positive potential is applied is provided in the upper part of the storage node 32, and a second PN junction is implemented there. Since the second PN junction is provided in a three-dimensional manner in this embodiment, it is possible to reduce the area occupied by a memory cell, and this embodiment is suitable for large scale integration. Furthermore, a cell plate is interposed between two storage nodes, so that it is possible to increase the storage capacitance.

Figure 7A:
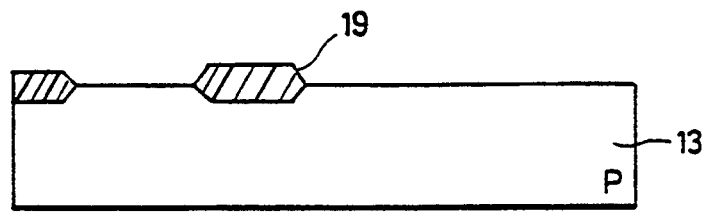
FIGS. 7A to 7G are cross sectional views illustrating respective steps of a manufacturing process of the memory cell illustrated in FIG. 3.
Figure 7B:
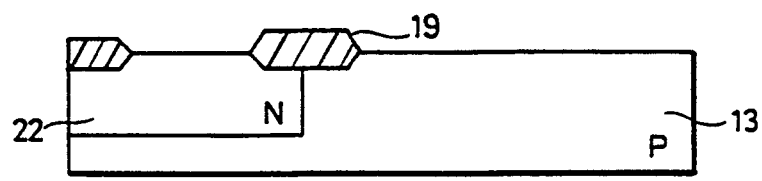
Figure 7C:
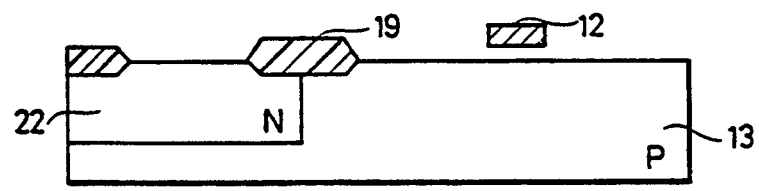
Figure 7D:
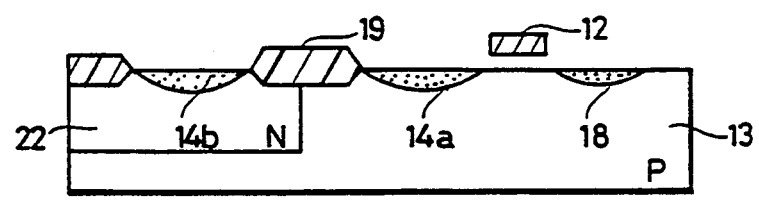
Figure 7E:
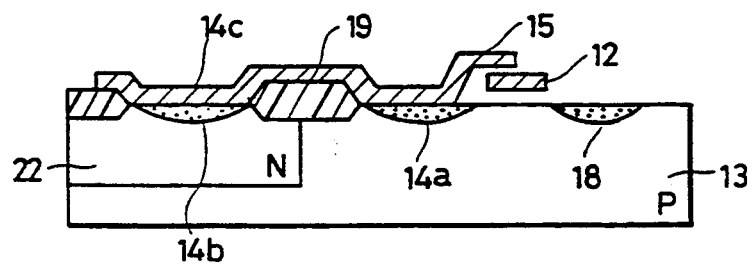
Figure 7F:
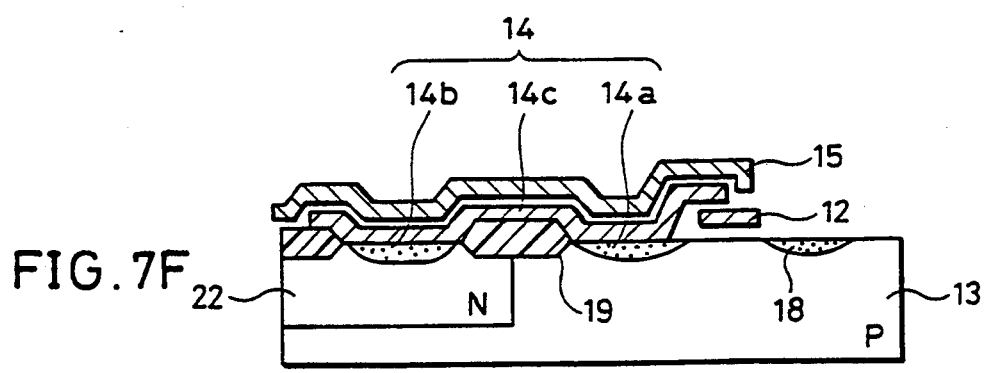
Figure 7G:
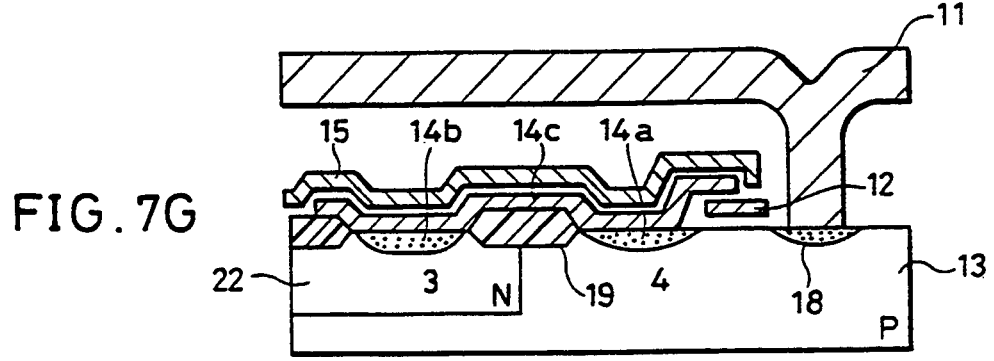

Now, referring to FIGS. 7A to 7G, description will be given of a manufacturing process of the memory cell according to the embodiment of the present invention illustrated in FIG. 3. First, an isolating oxide film 19 is formed on a P-type substrate 13 (FIG. 7A). Then, an N-type well region 22 is formed on the surface of P-type substrate 13 (FIG. 7B). Polycrystalline silicon 12 to be a word line is formed in a predetermined part on a main surface of P-type substrate 13 with an insulating film interposed therebetween (FIG. 7C). N-type diffusion regions 14a, 18 and a P-type diffusion region 14b are sequentially formed on the main surface of P-type substrate 13 and in N-type well region 22 by impurity implantation (FIG. 7D). Then, as illustrated in FIG. 7E, a tungsten storage node 14c is formed to be in contact with N-type diffusion region 14a and P-type diffusion region 14b (FIG. 7E). Am insulating film is formed on storage node 14c, and then a cell plate 15 is formed thereon (FIG. 7F). Thereafter, a bit line 11 connected to N-type diffusion region 18 is formed as illustrated in FIG. 7G.

Figure 8D:
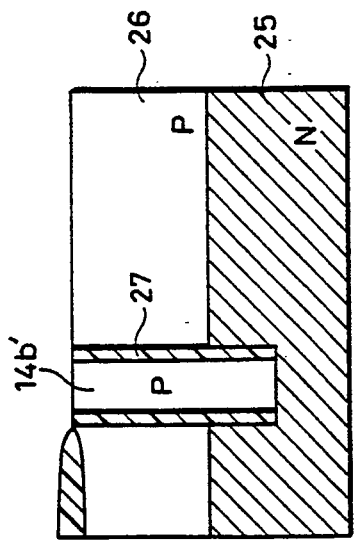
Figure 8E:
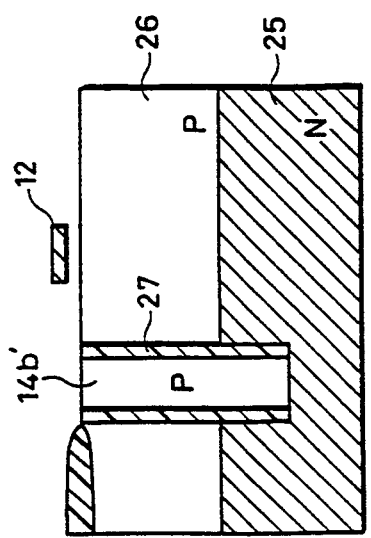
Figure 8A:
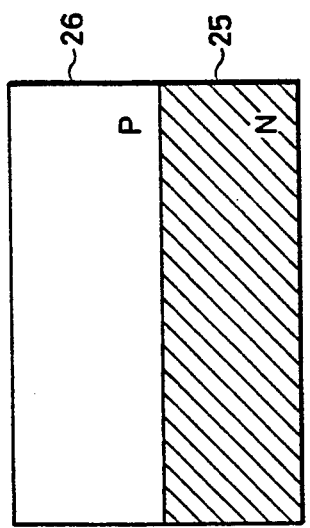
Figure 8B:
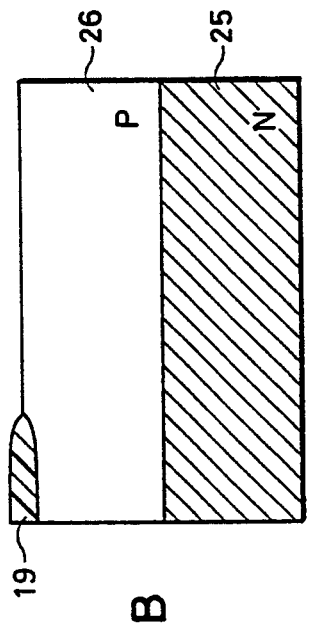
Figure 8C:
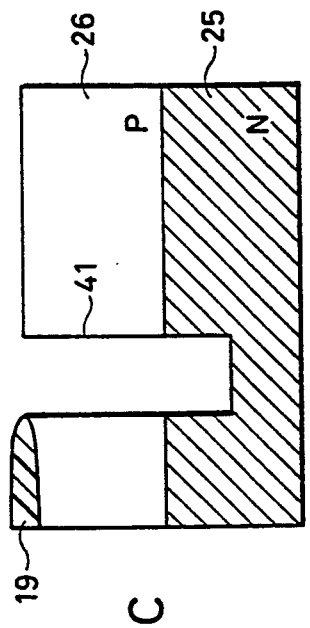
Figure 9:
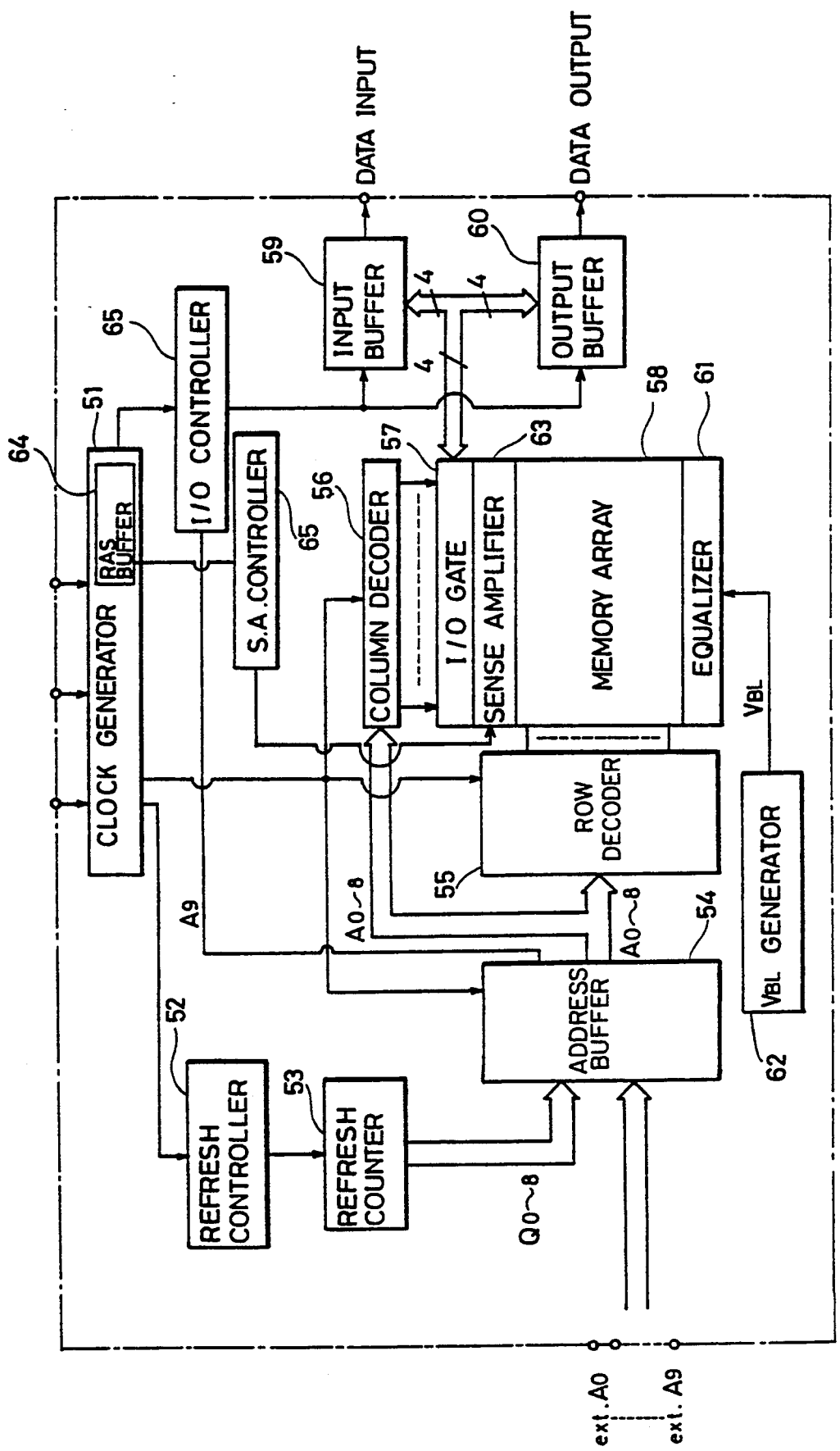
FIG. 9 is a block diagram illustrating a main part of a conventional DRAM.
Figure 10A:
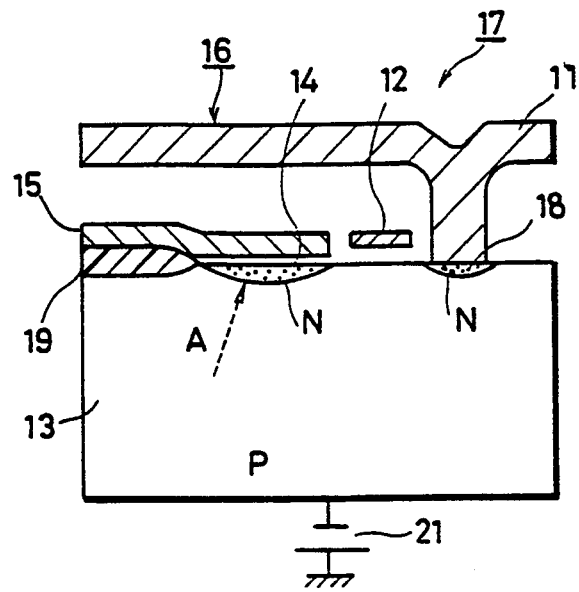
FIG. 10A is a cross sectional view of a memory cell in a conventional DRAM.
Figure 10B:
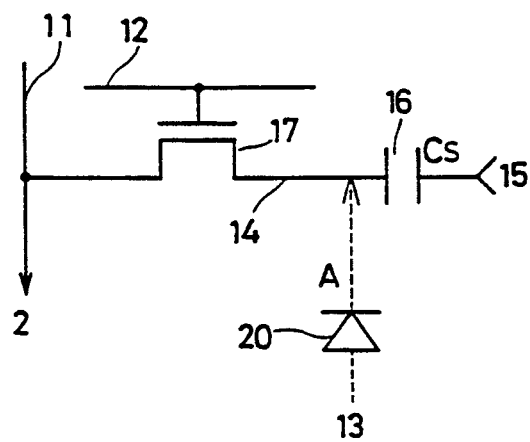
FIG. 10B is an equivalent circuit diagram of the memory cell in the conventional DRAM.
Figure 11A:
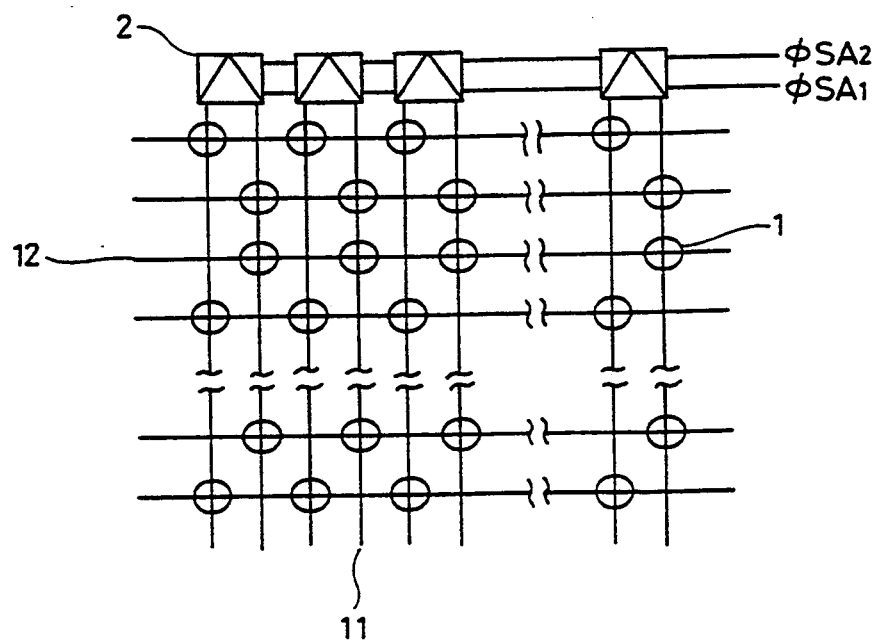
FIG. 11A is a typical diagram of a memory array in a general DRAM.
Figure 11B:
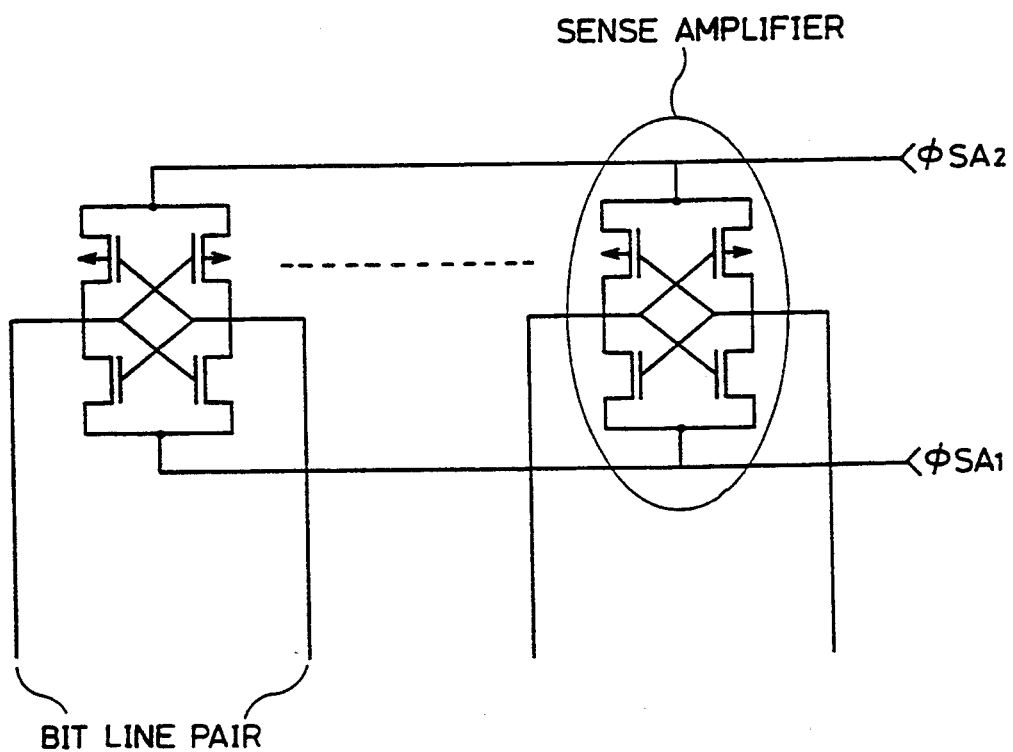
FIG. 11B is a diagram illustrating a main part of a sense amplifier.

Now, referring to FIGS. 8A to 8I, description will be given of a manufacturing method of the memory cell according to the embodiment of the present invention illustrated in FIG. 4. First, a P-type well layer 26 is formed on the surface of an N-type substrate 25 (FIG. 8A). An isolating oxide film 19 is formed in a predetermined part of the surface of P-type well layer 26 (FIG. 8B). Then, a trench 41 is formed to be adjacent to isolating oxide film 19 (FIG. 8C). The sidewall of trench 41 is oxidized to form an oxide film 27, and P-type polycrystalline silicon 14b' to be a storage node is buried (FIG. 8D). Then, polycrystalline silicon 12 to be a word line is formed in a predetermined part on P-type well layer 26 with an insulating film interposed therebetween (FIG. 8E). N-type impurities are implanted into a predetermined part on the surface of the P-type well layer to form N-type diffusion regions 14a, 18 to be source/drain regions (FIG. 8F). P-type polycrystalline silicon 14b' of the storage node and source/drain region 14a are connected by tungsten 14c (FIG. 8G). Polycrystalline silicon 42 to be a cell plate is deposited on tungsten 14c and on insulating oxide film 19 with an insulating film interposed therebetween (FIG. 8H). A bit line 11 connected to N-type diffusion region 18 is formed as illustrated in FIG. 8I. As described above, the memory cell illustrated in FIG. 4 is completed.

Although it is anticipated that the area of a memory cell is increased and the chip area is increased as compared to a conventional DRAM when a second PN junction is provided in a two-dimensional manner as in the embodiments of the present invention illustrated in FIGS. 3 and 4, it is clear that the degree of integration is higher than that of a SRAM which requires six elements for a memory cell. In consideration of the advantage of interval in a refresh operation which is much longer than in a conventional DRAM, it is possible to provide an inexpensive memory which has a chip area smaller than in a SRAM with low power consumption by using the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A DRAM comprising:
a semiconductor substrate of a first conductivity type having a main surface;
a first region of a second conductivity type formed on the main surface of said semiconductor substrate;
a storage capacitor formed on said main surface and including:
a second region of a second conductivity type formed on said main surface;
a third region of the first conductivity type formed in said first region of the second conductivity type and on the main surface of said semiconductor substrate;
a first conductive layer connecting said third region of the first conductivity type and said second region of the second conductivity type to recombine first minority carriers flowing from said semiconductor substrate to said second region of the second conductivity with second minority carriers flowing from said first region of the second conductivity type to said third region of the first conductivity type; wherein
said third region of the first conductivity type, said second region of the second conductivity type, and said first conductive layer constitute a storage node of the storage capacitor,
a second conductive layer having a first portion formed on said third region of the first conductivity type with an insulating film interposed therebetween; and
a second portion formed on said second region of the second conductivity type with an insulating film interposed therebetween,
said first and second portions being integrally formed.

2. A DRAM comprising:
a memory cell including one transistor and one capacitor formed on a semiconductor substrate having a main surface;
said capacitor including:
a storage node formed on said main surface of said semiconductor substrate and comprising first and second regions of opposite conductivity types, and
a cell plate formed on said storage node with an insulating film interposed therebetween; and compensating means connected to said storage node for compensating fluctuations in the potential of said storage node caused by minority carriers flowing from said semiconductor substrate to said storage node, said compensating means including a conductive layer connecting said first and second regions.

3. A DRAM comprising:
a memory cell including one transistor and one capacitor formed on a semiconductor substrate having a main surface;
said capacitor including
a storage node formed on said main surface of said semiconductor substrate, and
a cell plate formed on said storage node with an insulating film interposed therebetween;
means connected to said storage node for introducing first carriers; and
means connected to said storage node for introducing second carriers having a polarity different from the polarity of said first carriers;
said storage node comprising means for recombining said first and second carriers;
wherein said means for introducing first carriers are separated from said means for introducing second carriers by an insulating layer formed on said main surface.

4. The DRAM according to claim 2, wherein said capacitor includes a trench-type capacitor.

5. A DRAM comprising:
a first region of a first conductivity type;
a second region of a second conductivity type formed on said first region of the first conductivity type and having a main surface;
a third region of the first conductivity type formed in said second region of the second conductivity type and on said main surface; and
a trench extending through said main surface of said second region of the second conductivity type, said second region of the second conductivity type, and said first region of the first conductivity type;
the sidewall of said trench being separated from said third region of the first conductivity type, said second region of the second conductivity type, and said first region of the first conductivity type by an insulating film,
a fourth region of the second conductivity type being formed inside said trench,
a PN junction being formed between said fourth region of the second conductivity type and said first region of the first conductivity type; and
connection means for connecting said third region of the first conductivity type and said fourth region of the second conductivity type.

6. A DRAM comprising: a semiconductor substrate of a first conductivity type having a main surface;
first and second regions of a second conductivity type formed spaced apart from each other on the main surface of said semiconductor substrate to be source/drain regions of a transfer gate transistor;
a first conductive layer formed of a refractory metal and having at least a part of it connected to either said first region or said second region;
a second conductive layer formed on said first conductive layer with an insulating film interposed therebetween;

a third conductive layer of said first conductivity type formed on said second conductive layer with an insulating film interposed therebetween; and a fourth conductive layer of said second conductivity type having at least a part of it connected to said third conductive layer, wherein a part of said first conductive layer and a part of said third conductive layer are connected.

7. The DRAM according to claim 2, wherein said first and second regions are separated by an insulating layer formed on said main surface.

* * * * *